United States Patent
Lutgen

(10) Patent No.: US 7,551,660 B2
(45) Date of Patent: Jun. 23, 2009

(54) OPTICALLY PUMPED SEMICONDUCTOR LASER DEVICE

(75) Inventor: Stephan Lutgen, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 551 days.

(21) Appl. No.: 10/513,364

(22) PCT Filed: May 5, 2003

(86) PCT No.: PCT/DE03/01426

§ 371 (c)(1),
(2), (4) Date: Jun. 6, 2005

(87) PCT Pub. No.: WO03/094311

PCT Pub. Date: Nov. 13, 2003

(65) Prior Publication Data

US 2005/0226302 A1 Oct. 13, 2005

(30) Foreign Application Priority Data

May 3, 2002 (DE) .................. 102 19 907

(51) Int. Cl.
  H01S 5/00 (2006.01)
  H01S 3/09 (2006.01)
  H01S 3/091 (2006.01)

(52) U.S. Cl. ............ 372/50.124; 372/50.1; 372/69; 372/70; 372/75

(58) Field of Classification Search ......... 372/50.124, 372/69–70, 75
See application file for complete search history.

(56) References Cited

U.S. PATENT DOCUMENTS

| 6,339,607 B1 | 1/2002 | Jiang et al. | |
| 6,535,537 B1 * | 3/2003 | Kinoshita | 372/50.11 |
| 6,628,696 B2 * | 9/2003 | Thornton | 372/98 |
| 6,954,479 B2 * | 10/2005 | Albrecht et al. | 372/50.1 |
| 2002/0001328 A1 * | 1/2002 | Albrecht et al. | 372/50 |
| 2002/0075935 A1 * | 6/2002 | Clayton | 372/75 |
| 2005/0008056 A1 * | 1/2005 | Albrecht et al. | 372/50 |

FOREIGN PATENT DOCUMENTS

| CN | 1331494 | 1/2002 |
| EP | 0 999 621 A | 5/2000 |
| EP | 1 130 713 A | 9/2001 |
| JP | 7 249824 A | 9/1995 |
| WO | WO 01/93386 A | 12/2001 |
| WO | WO 01/93386 A1 | 12/2001 |
| WO | WO 02/067393 A1 | 8/2002 |

OTHER PUBLICATIONS

Gerhold M.D. et al., "Novel Design of a Hybrid-Cavity Surface-Emitting Laser", IEEE Journal of Quantum Electronics, vol. 34, No. 3, pp. 506-510, Mar. 1, 1998.

* cited by examiner

Primary Examiner—Minsun Harvey
Assistant Examiner—Phillip Nguyen
(74) Attorney, Agent, or Firm—Cohen Pontani Lieberman & Pavane LLP

(57) ABSTRACT

An optically pumped semiconductor laser apparatus. The apparatus includes a vertical emitter which has a central waveguide and a quantum well structure which is arranged within the central waveguide and has at least one quantum layer. The apparatus also includes a pump radiation source, which optically pumps the quantum well structure and comprises at least one pump waveguide in which the pump radiation is guided. The width of the central waveguide is greater than the width of the pump waveguide, with the width of the central waveguide and the width of the pump waveguide being matched to one another such that the quantum well structure of the vertical emitter is pumped uniformly.

23 Claims, 6 Drawing Sheets

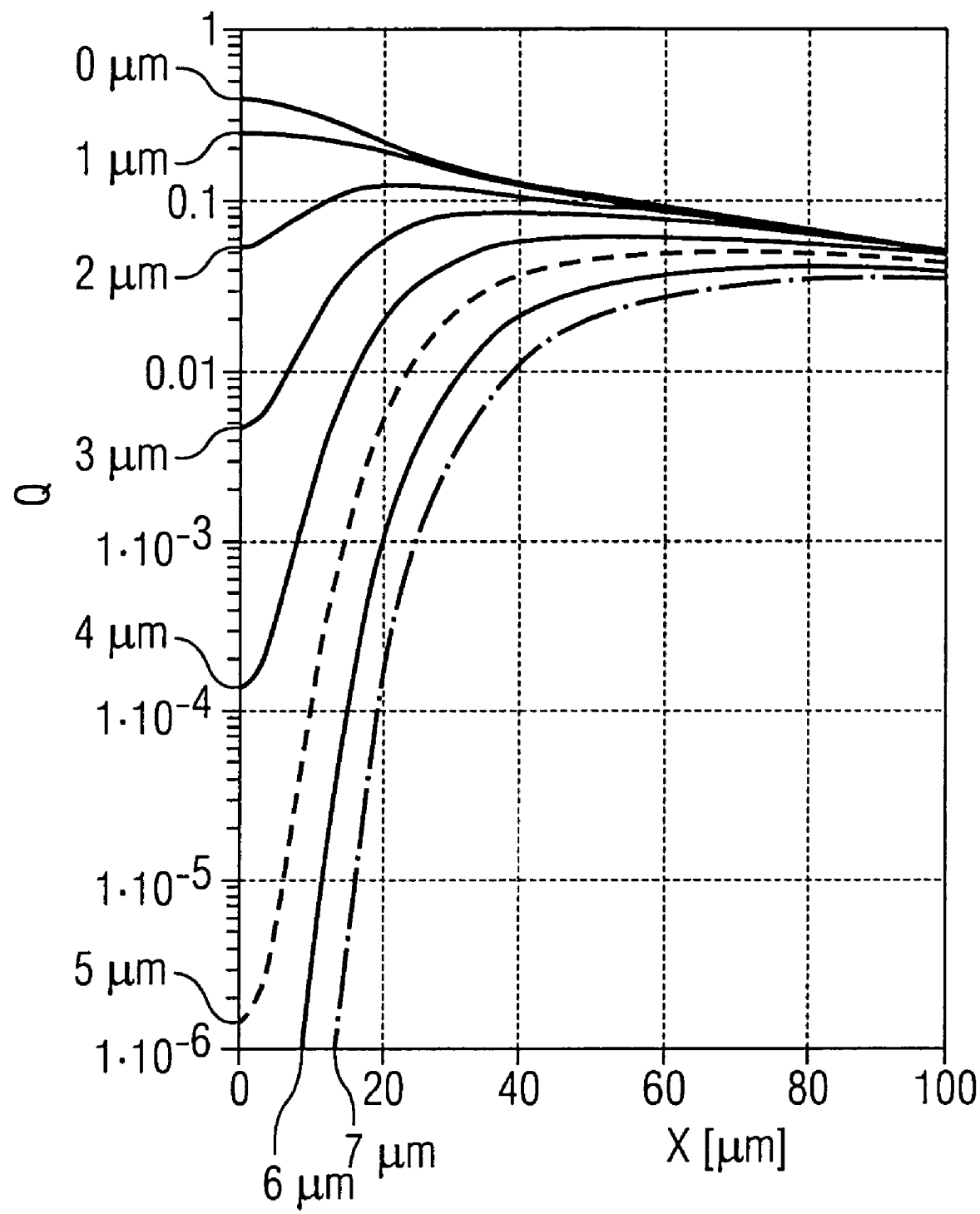

OPTICALLY PUMPED SEMICONDUCTOR LASER DEVICE

RELATED APPLICATIONS

This is a U.S. national stage of application No. PCT/DE03/01426, filed on May 5, 2003.

This patent application claims the priority of German patent application no. 102 19 907.8 filed May 3, 2002, the disclosure content of which is hereby incorporated by reference.

FIELD OF THE INVENTION

The invention relates to an optically pumped semiconductor laser apparatus.

BACKGROUND OF THE INVENTION

Laser apparatuses such as these are known, for example, from the documents WO 01/93386 and WO 02/067393, the contents of which are incorporated in the present description by reference. These documents describe a surface-emitting semiconductor laser apparatus, which contains a laterally optically pumped quantum well structure. An edge-emitting semiconductor laser is used, by way of example, as the pump radiation source for this quantum well structure. The pump radiation is guided in a waveguide within the pump radiation source. The pump radiation source and the quantum well structure are each formed by means of a semiconductor layer sequence, with the semiconductor layer sequences being grown epitaxially on a common substrate. This allows low-cost monolithic integration of the quantum well structure and the pump radiation source.

In principle, an increase in the optical output power can be achieved by enlarging the optically pumped volume. To do this, it is desirable to increase the lateral diameter of the optically pumped structure, in which case fundamental mode operation would preferably be possible, or should preferably be retained.

However, merely enlarging the lateral diameter leads to problems, which will be explained in the following text with reference to FIG. 8:

FIG. 8 shows an optically pumped semiconductor laser apparatus having a vertical emitter 20, which has a radiation-producing structure with two or more quantum layers 21. The radiation-producing structure may be surrounded by mirrors 25 on one side or both sides in order to form a vertical laser resonator. Two pump lasers 22 are arranged laterally adjacent, in order to produce the pump radiation. The pump lasers 22 each have a waveguide 23, in which the pump radiation is guided.

In known apparatuses of this type, these waveguides are arranged at the same height as the quantum layers 21, in order to efficiently inject the pump radiation into the radiation-producing structure. In particular, the quantum layers 21 are aligned centrally with the pump waveguide 23 and are formed as close as possible to its center axis 26, so that the spatial maximum of the pump field 24 precisely overlaps the quantum layers of the vertical emitter. This requires very precise manufacture.

If the lateral diameter of the vertical emitter is enlarged, it is evident that only a very restricted increase in the optical output power is possible by this enlargement on its own or in conjunction with a higher pump power. This is because the quantum layers strongly absorb the pump radiation when the pump radiation is aligned precisely with the quantum layers.

The pump radiation is thus absorbed in particular in the vicinity of the boundary surface between the pump laser and the vertical emitter, thus resulting in a short lateral penetration depth. Beyond this lateral penetration depth, the vertical emitter is scarcely pumped at all. Laser operation is thus achieved only at the edge of the vertical emitter, in a comparatively small area, which is typically narrower than 30 μm.

Enlarging the lateral diameter or increasing the pump power does not change the penetration depth, so that the optical output power is increased only slightly in this way. In particular, this does not result in an increase in the output power as a result of enlargement of the pumped active area.

Furthermore, pumping of the quantum layers in the vicinity of the boundary surface between the pump laser and the vertical emitter is associated with additional losses, since the charge carriers which are produced during the pumping process diffuse within a diffusion length of about 10 μm with respect to the boundary surface, where they can recombine, without emitting radiation, as a result of boundary surface defects. For this reason as well, it is desirable to enlarge the lateral diameter of the vertical emitter in order to pump the quantum layers in this way as far as possible away from this boundary surface. However, once again, merely enlarging the lateral diameter is not sufficient, since this does not change the absorption close to the edge within a comparatively short penetration depth.

SUMMARY OF THE INVENTION

One object of the present invention is to provide an optically pumped semiconductor apparatus with a high output power. Another object of the invention is to allow lateral enlargement of the optically pumped area.

This and other obiects are attained in accordance with one aspect of the invention directed to an optically pumped semiconductor laser apparatus having a vertical emitter which has a central waveguide and has a quantum well structure with at least one quantum layer within the central waveguide, and having a pump radiation source, which optically pumps the quantum well structure and comprises at least one pump waveguide in which the pump radiation is guided, with the width of the central waveguide of the vertical emitter being greater than the width of the pump waveguide, and these widths being matched to one another such that the quantum well structure of the vertical emitter is pumped uniformly.

With regard to the vertical emitter, the expression "central waveguide" in this case does not mean an indication of its position in the sense of an inevitably central arrangement, but should be regarded only as distinguishing it from the pump waveguide.

The width of the pump waveguide or central waveguide is in each case measured at right angles to the propagation direction.

For the purposes of the invention, the expression uniform pumping means, in particular, stimulation of the quantum well structure in which no stimulation minimum occurs in the center of the vertical emitter, or in which radiation is also produced at least in the center of the vertical emitter. In this case, stimulation with a stimulation maximum at the center of the vertical emitter is advantageous, preferably in such a way that fundamental mode operation of the vertical emitter, for example in the TEM$_{oo}$ mode, is possible. Large-area stimulation with a diameter of the vertical emitter of greater than or equal to 20 μm is particularly preferable. Furthermore, for the purposes of the invention, the production of an at least approximately Gaussian, hypergaussian or square-wave stimulation profile corresponds to uniform pumping, once again with a large-area stimulation profile being preferable.

In one advantageous embodiment of the invention, the quantum layers are arranged at a distance from a pump waveguide center axis which runs in the propagation direction of the pump radiation. In contrast to the arrangements shown in FIG. 8, this results in the with an offset with respect to the quantum layers of the vertical emitter. In this case, it is advantageous to arrange the quantum layers of the vertical emitter such that their distance from the center axis of the pump waveguide is greater than the beam radius of the pump radiation field on entry in the vertical emitter. This can be achieved, for example, by means of a pump waveguide whose half width is less than the distance between the quantum layer of the vertical emitter and the center axis of the pump waveguide.

Surprisingly, within the context of the invention, it has been found that, if the vertical emitter has a large lateral diameter, this thus, overall, allows a larger overlap of the pump radiation with the quantum layers in the center of the vertical emitter, and thus a larger-area and more efficient operation, with a higher output power. This conflicts with the conventional assumption that a central arrangement of the quantum well structure with respect to the pump waveguide is optimum for efficient injection. This assumption accordingly applies only to small lateral diameters.

It should be noted that the stated distance should be regarded as a predetermined well-defined distance between the quantum layer and the center axis. A distance can admittedly also occur between the quantum layer and the corresponding center axis in the apparatus shown in FIG. 8, for example because the quantum layers necessarily cannot all coincide with the center axis if there are two or more quantum layers, or because a distance such as this is within the manufacturing tolerance. However, in contrast to the invention, this is not a predetermined and well-defined distance.

Furthermore, in this context, it is advantageous for the width of the pump waveguide and the width of the central waveguide to be matched to one another such that the pump radiation widens after it enters the vertical emitter. By means of this, it is achieved that the pump radiation overlaps with the quantum layers at a predetermined distance from the entry of the pump radiation into the vertical emitter. Stimulation of the quantum layers in the vicinity of the boundary surface between the pump radiation source and the vertical emitter, and the losses due to recombination without radiation associated with this, can thus be considerably reduced.

For the purposes of the invention, the pump waveguide and the central waveguide may be arranged symmetrically or asymmetrically with respect to one another. In the case of an asymmetric arrangement, the center axis of the pump waveguide and a center axis of the central waveguide do not coincide and are preferably arranged parallel to one another. An asymmetric arrangement may be advantageous with regard to the epitaxial production of the vertical emitter or of the semiconductor laser apparatus.

The invention is particularly suitable for semiconductor laser apparatuses with a high optical output power, for example greater than or equal to 0.1 W, preferably greater than or equal to 1.0 W, or even greater than or equal to 10 W. The pump radiation source is for this purpose preferably in the form of a pump laser. In order to produce the pump power which is required for a high output power, the pump radiation source preferably has two or more pump lasers. These may be arranged such that two pump lasers in each case radiate into the vertical emitter from opposite sides. Furthermore, it is expedient to position the pump lasers in a cruciform shape or star shape around the vertical emitter.

BRIEF DESCRIPTION OF THE DRAWINGS

FIG. 3 shows an illustration in the form of a graph of the overlap of the pump radiation and quantum layer along the propagation direction of the pump radiation.

DETAILED DESCRIPTION OF THE DRAWINGS

Identical elements, or elements having the same effect, are provided with the same reference symbols in the figures.

Figure 1:
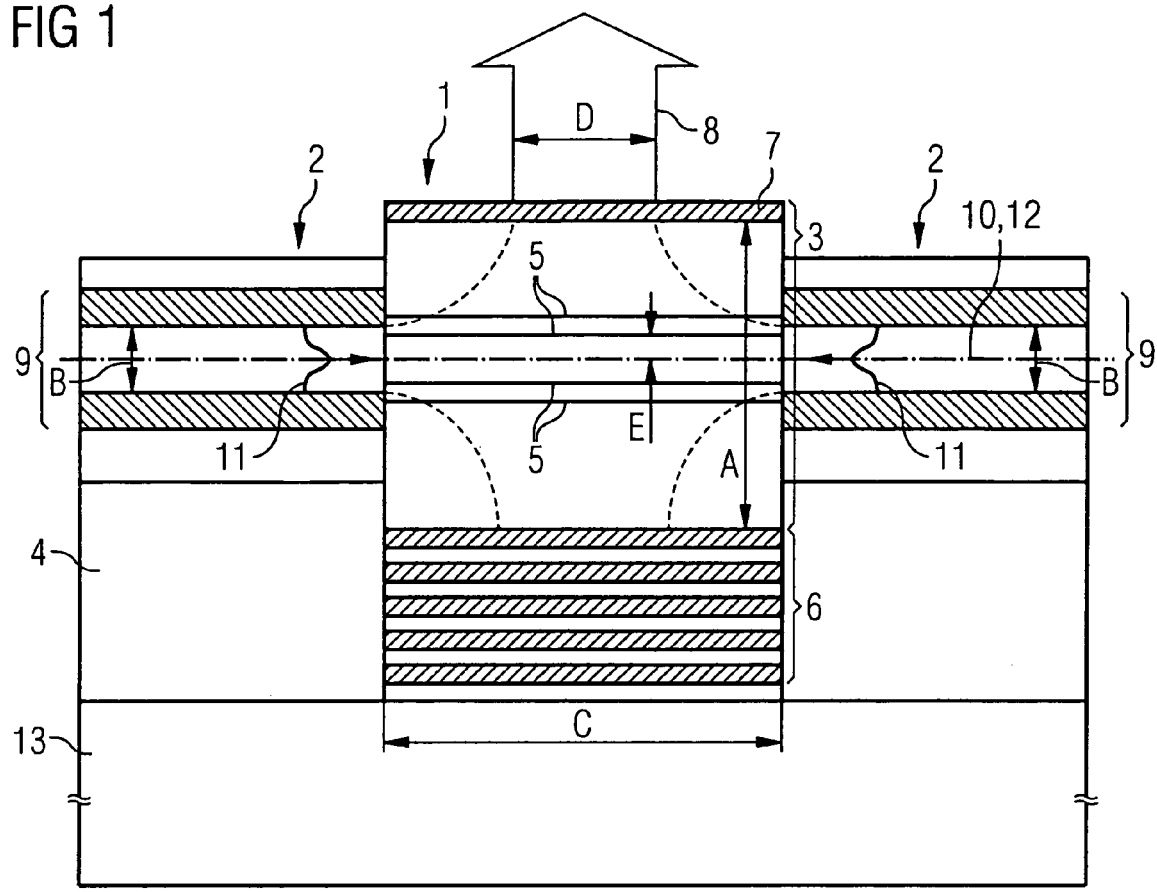
FIG. 1 shows a schematic section view of a first exemplary embodiment of a semiconductor laser apparatus according to the invention.

The semiconductor laser apparatus illustrated in FIG. 1 has a vertical emitter 1 and a pump radiation source in the form of two pump lasers 2. In a preferred embodiment, the semiconductor laser apparatus is a semiconductor disk laser.

The vertical emitter 1 has a central waveguide 3 as well as a quantum well structure which produces radiation, is arranged within the central waveguide 3 and has two or more quantum layers 5. A mirror 6 is arranged downstream from the central waveguide in the vertical direction. This mirror is preferably a Bragg mirror with two or more alternating layers of different refractive indices. An output layer 7, through which the radiation 8 that is produced by the vertical emitter is coupled out, is applied on the top of the central waveguide 3, opposite the mirror.

Together with an external mirror (not illustrated), the mirror 6 can form an external laser resonator for the vertical emitter. An apparatus such as this is also referred to as a VECSEL (Vertical External Cavity Surface Emitting Laser). Alternatively, a semi reflecting output mirror, preferably a Bragg mirror, may be arranged between the output layer 7 and the central waveguide 3 in order to form an internal resonator in the form of a VCSEL (Vertical Cavity Surface Emitting Laser).

Furthermore, a non-linear optical element, for example a non-linear crystal, can be arranged in an external laser resonator for frequency conversion. This embodiment is advantageous for frequency conversion, in particular for frequency multiplication, for example for frequency doubling, of the radiation 8 that is produced by the quantum well structure. This embodiment of the invention can likewise be used for other non-linear conversions such as sum frequency generation, difference frequency generation, generation of sub-harmonics, Raman scattering or four-wave mixing, with the radiation field that is generated by the vertical emitter optionally being superimposed with a further radiation field, which is produced by way of example externally, in the non-linear optical element.

In a further embodiment of the invention, an element for mode coupling, preferably for passive mode coupling such as KLM (Kerr Lens Modelocking), may be provided in the external laser resonator. A saturable semiconductor absorber (for example a SESAM, Semiconductor Saturable Absorber Mirror) is, for example, suitable for this purpose. The mode coupling allows pulse operation of the laser that is formed by the vertical emitter. This makes it possible to achieve pulse durations down to the picosecond or even femtosecond range.

For operation in the femtosecond range, it is generally necessary to compensate for the group velocity dispersion in the external resonator since, otherwise, the group velocity dispersion leads to widening of the time duration of the pulses which are produced. Compensation for group velocity dispersion can be achieved, for example, by means of prisms, gratings or optical fibers and is used, for example, in known fs-titanium-sapphire lasers.

In the case of the invention, the group velocity dispersion is preferably compensated for by means of so-called "chirped mirrors". These mirrors have two or more material layers, which are matched to the group velocity conditions in the external resonator, such that the group velocity dispersion is compensated for, overall. For the purposes of the invention, the external mirror as mentioned above, or an additional resonator mirror, for example in the case of a folded external resonator, may be in the form of a chirped mirror.

The laterally arranged two pump lasers 2 each have an active layer as well as a pump waveguide 9 with a center axis 10 in which the pump radiation 11 is guided. As indicated in FIG. 1, the pump radiation 11 has an approximately Gaussian profile. Furthermore, a buffer layer 4 may be provided in order to position the pump waveguide at a suitable height with respect to the central waveguide in the vertical direction.

The quantum layers 5 are arranged at a predetermined distance from the center axis 10, with the quantum layer or quantum layers 5 located closest to the center axis 10 being at a distance E from the center axis.

Pump lasers and vertical emitters are preferably monolithically integrated, that is to say they are grown epitaxially on a common substrate 13. After production, this substrate 13 may be thinned, or else may be completely removed. This is expedient, for example, for improved heat emission to a heat sink.

In a further alternative of the invention, the mirror 6 is applied to the upper face of the central waveguide so that the central waveguide 3 lies between the mirror 6 and the substrate 13. The radiation is then coupled out through the substrate, on the side of central waveguide 3 opposite the mirror. The substrate may be thinned or removed in this case as well.

During operation, the pump radiation that is produced by the pump lasers 2 is injected laterally into the quantum well structure, is absorbed in the quantum layers 5, and thus stimulates the emission of the radiation 8 (optical pumping). When the vertical emitter is in the form of a laser, the quantum well structure is used as the optically pumped active medium, in which the laser radiation is generated or amplified by stimulated emission.

The width A of the central waveguide 3 in the invention is greater than the width B of the pump waveguide, and is matched to the latter such that the quantum well structure of the vertical emitter is pumped uniformly, and preferably over a large area. In detail, this is achieved in the case of the exemplary embodiment shown in FIG. 1, by beam widening of the pump radiation, and by arranging the quantum layers 5 at a distance from the center axis 10 of the pump waveguide 9.

The beam widening is based on the diffraction of the pump radiation field 11 after it passes from the pump waveguide 9 into the considerably broader central waveguide 3. The number of modes in the central waveguide is in this case so great that approximately free propagation of the pump radiation can be assumed in the central waveguide. The profile of the pump radiation can be determined by means of Gaussian optics. Gaussian optics as well as definitions of the associated characteristic parameters are described in A. Yariv, Quantum Electronics, $3^{rd}$ Ed., 1988, John Wiley & Sons.

Figure 2:
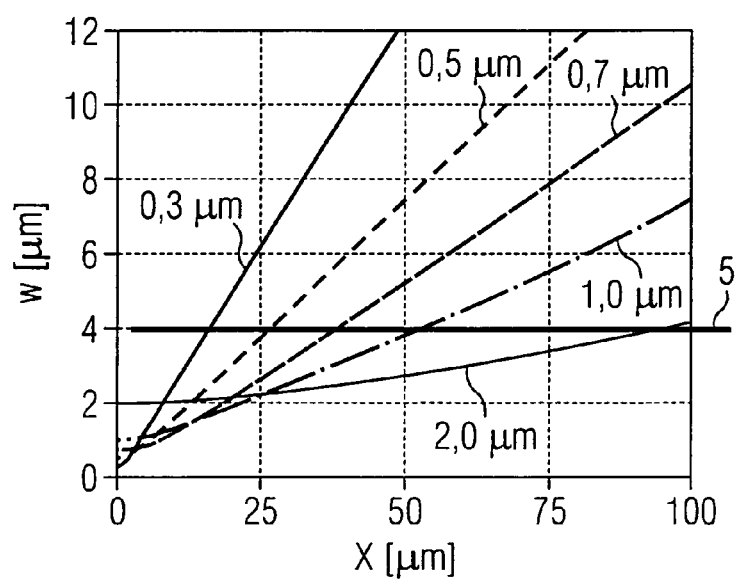
FIG. 2 shows an illustration, in the form of a graph, of the beam widening of the pump radiation in the central waveguide along the propagation direction of the pump radiation.

By way of example, FIG. 2 shows the beam widening of the pump radiation for different beam radii of the pump radiation on entering the vertical emitter. The graph in FIG. 2 shows the beam radius w of a Gaussian-shaped bundle along the lateral propagation direction X for various beam radii (0.3 μm; 0.5 μm; 0.7 μm; 1.0 μm; 2.0 μm) on entry into the vertical emitter. The beam radius on entry is governed by the pump waveguide, and corresponds to half the width B of the pump waveguide. The illustrated profiles were calculated for a pump wavelength of 940 nanometers.

FIG. 2 also shows the position of a quantum layer 5 at a distance E of four micrometers, by way of example, from the center axis of the pump waveguide. Any overlap between the quantum layer and the pump radiation field occurs further from the entry of the pump radiation field, and thus further away from any boundary surface which may lead to non-radiating losses, the greater the width of the pump waveguide. This is because the diffraction, and hence the beam widening, decrease as the width increases.

Uniform pumping of the quantum well structure can also be achieved by optimization of the distance E between the quantum layers and the center axis of the pump waveguide. This is illustrated by way of example in FIG. 3.

FIG. 3 shows, logarithmically, the calculated overlap Q (in arbitrary units) between the pump field and a quantum layer along the lateral propagation direction X in the vertical emitter for various distances E between the quantum layer and the center axis of the pump waveguide. The values 1 μm, 2 μm, 3 μm, 4 μm, 5 μm, 6 μm, and 7 μm were chosen for these distances E. In addition, the figure also shows the overlap for a quantum layer located on the center axis, that is to say where the distance is 0 μm.

The parameters of the fundamental semiconductor laser structure which have been referred to above in conjunction with FIG. 2 were adopted unchanged. The width of the pump waveguide is 1.4 μm, corresponding to a beam radius of 0.7 μm on entry to the vertical emitter.

Figure 8:
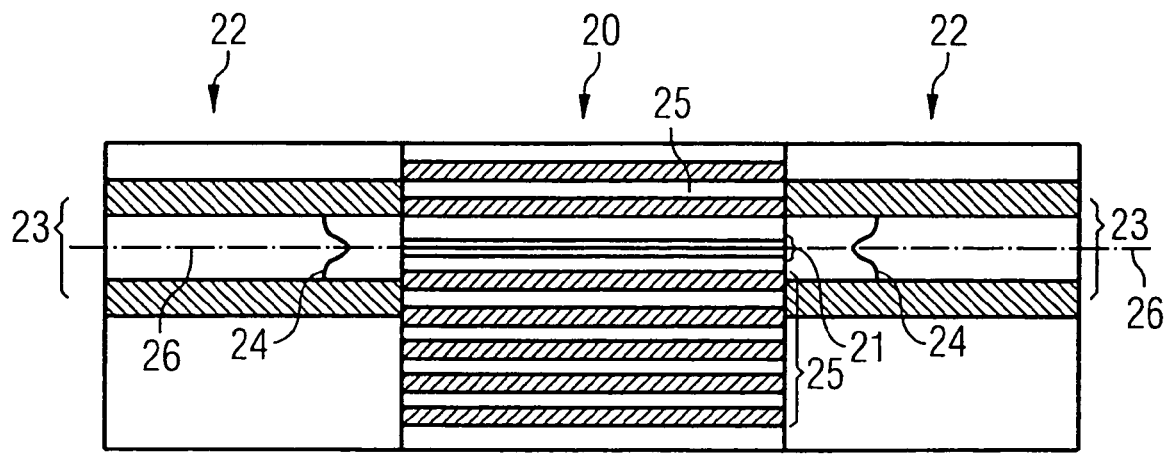
FIG. 8 shows a schematic section view of a corresponding semiconductor laser apparatus with a conventional pump arrangement.

The profile of the overlap Q corresponds essentially to the lateral absorption profile. As is shown in FIG. 3, if the distance between the quantum layer and the center axis is less than or equal to 1 μm, an absorption maximum occurs when the pump radiation enters the vertical emitter, with a subsequent approximately exponential decay. This corresponds to conventional pump arrangements, such as those illustrated by way of example in FIG. 8. In this case, a lateral enlargement of the vertical emitter leads only to a slight increase in the optical output power, since the pump radiation is essentially absorbed at the edge of the vertical emitter and hence small-area radiation production and small-area laser operation are achieved only there, in an area which is typically narrower than 20 μm.

As the distance between the quantum layer and the center axis increases, the absorption maximum moves toward the center of the vertical emitter. In this case, the absorption maximum becomes ever less pronounced as the distance increases, so that this results in an absorption profile which is localized more in the center of the vertical emitter, and thus in increasingly uniform stimulation of the quantum layer. In particular, this avoids stimulation at the edge of the vertical emitter, thus advantageously reducing losses resulting from non-radiating recombination at the edge of the vertical emitter.

Overall, it is evident from FIGS. 2 and 3 in conjunction with further calculations that, for the exemplary embodiment shown in FIG. 1 and for a pump wavelength of 940 nanometers, it is advantageous for the width B of the pump waveguide to be greater than or equal to 1 μm, in conjunction with the distance E between the quantum layers and the center axis of the pump waveguide being 4 μm or more. This makes it possible, in particular, to achieve uniform and large-area stimulation of the quantum well structure.

The width A of the central waveguide is preferably in the range between 5 μm and 30 μm. A range between 10 μm and 30 μm is particularly preferable with regard to the distance mentioned above between the quantum layer and the center axis of the pump waveguide.

The invention is particularly suitable for vertical emitters with a large lateral diameter C between 10 μm and 1000 μm, which is preferably greater than or equal to 100 μm. A diameter C of greater than or equal to 20 μm is advantageous in order to avoid non-radiating recombination close to the boundary surface, since the diffusion length of the charge carriers is approximately 10 μm. Non-radiating recombination is significantly reduced by stimulation at a distance from the edge of the vertical emitter which is greater than this diffusion length. In the exemplary embodiment shown in FIG. 1. this diameter C is preferably between 200 μm and 300 μm. and the beam diameter D is between 100 μm and 200 μm.

By way of example, the vertical emitter in the exemplary embodiment shown in FIG. 1 has four quantum layers. Said distance in this case relates to the quantum layer which is located closest to the center axis 10. A different number of quantum layers may, of course, also be chosen for the purposes of the invention.

Figure 4A:
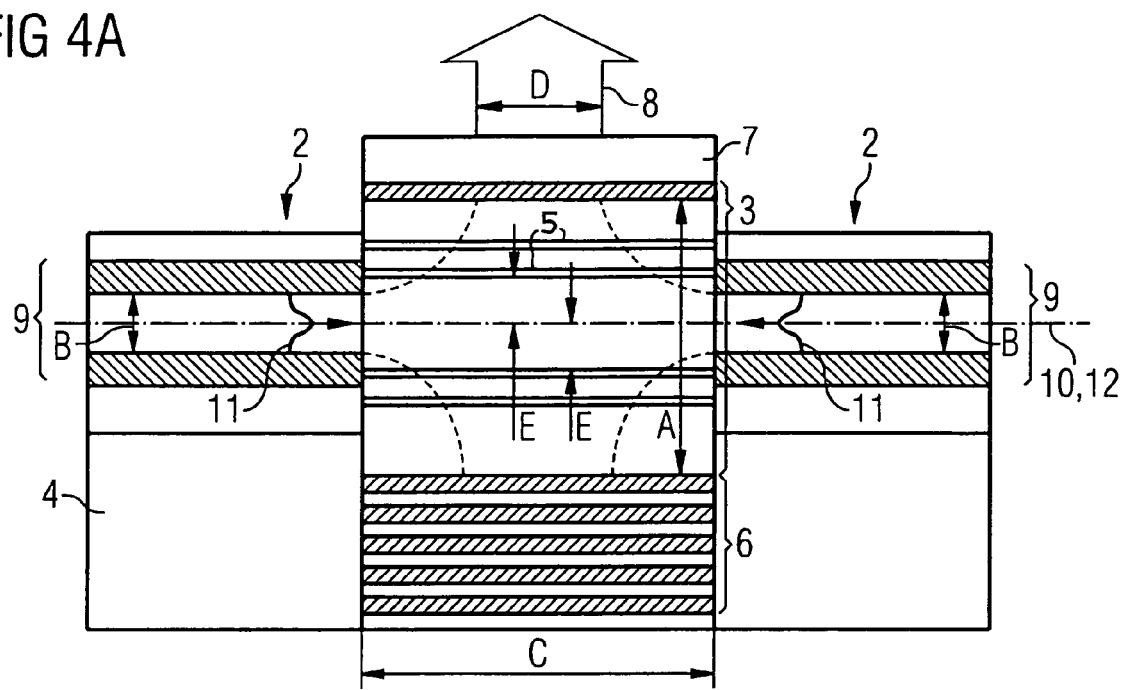
FIGS. 4A and 4B show a schematic section view and an associated plan view of a second exemplary embodiment of a semiconductor laser apparatus according to the invention.
Figure 4B:
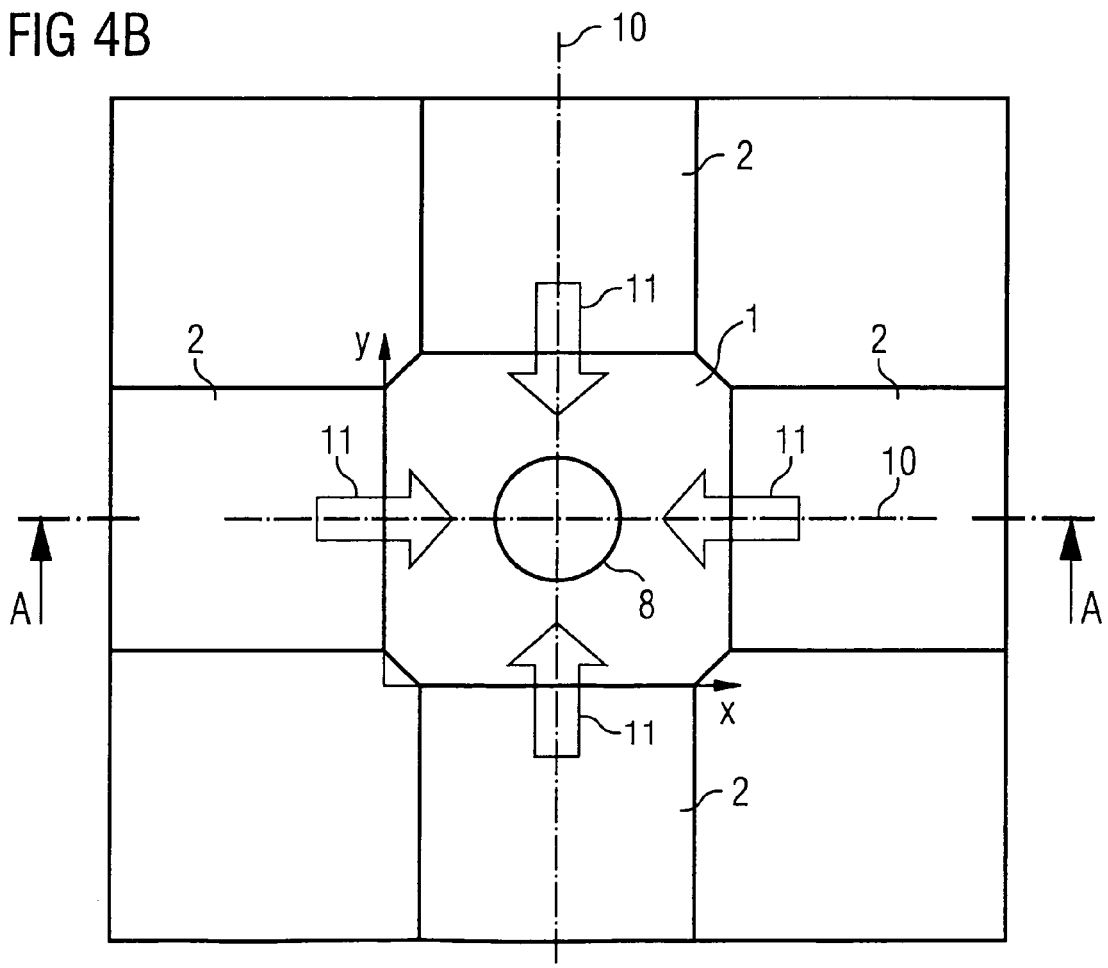

FIG. 4A shows a section illustration of a second exemplary embodiment of a semiconductor laser apparatus according to the invention, and FIG. 4B shows the associated plan view. The section plane shown in FIG. 4A runs along the line A-A in FIG. 4B.

As in the case of the exemplary embodiment illustrated in FIG. 1, the semiconductor laser structure has a vertical emitter 1 with a central waveguide 3, a mirror 6 which is arranged vertically downstream of the central waveguide, and an output layer 7 at the top.

The pump radiation source is arranged laterally adjacent. The pump radiation source in the exemplary embodiment shown in FIG. 4 has four pump lasers 2, which are arranged around the vertical emitter 1. The pump lasers 2 are positioned at right angles to one another in pairs, with two pump lasers 2 in each case radiating into the vertical emitter 1 from two opposite sides. This symmetrical arrangement is advantageous for uniform stimulation of the quantum well structure.

Alternatively, any other number of pump lasers may also be provided, with two or more pump lasers preferably being arranged in a star shape around the vertical emitter.

The pump lasers 2 each have a pump waveguide 9 with a center axis 10, as in the exemplary embodiment shown in FIG. 1. Owing to the star-shaped symmetrical arrangement, the center axes 10 of the respectively opposite pump waveguides 9 coincide, and are at right angles to the center axes of the two other pump waveguides.

Four quantum layers 5 are formed within the central waveguide 3. In contrast to the exemplary embodiment shown in FIG. 1, these are arranged at a vertical distance from the center axes which is greater than half the width B of the pump waveguide. This means that the pump radiation field on entry to the vertical emitter does not overlap the quantum layers (a minor overlap resulting from theoretically unlimited flanks of a three-dimensionally Gaussian pump field are ignored in this case).

An overlap between the pump radiation field 11 and the quantum layers 5 occurs only at a predetermined distance from the entry of the pump radiation field 11 into the vertical emitter 1. This distance is determined by the beam widening of the pump radiation field in conjunction with the distance E between the quantum layers 5 and the center axes 10 of the pump waveguides 9.

A pump waveguide with a width between 0.2 μm and 2 μm in conjunction with a central waveguide 3 with a width between 2 μm and 14 μm is suitable for uniform stimulation of a vertical emitter 1 with a large lateral diameter C between 200 μm and 300 μm and a beam diameter D between 100 μm and 200 μm. The pump wavelength may, for example, be 940 nm and the emission wavelength of the vertical emitter be 1000 nm.

The quantum layers are preferably arranged at a distance of between 1 μm and 6 μm from the center axes 10 of the pump waveguides 9. A distance of 5 μm in conjunction with a central waveguide having a width of somewhat more than 10 μm has been found to be particularly advantageous. The quantum layers are in this case arranged close to the edge of the central waveguide, and in particular at a maximum of the radiation field of standing waves which is formed in the vertical emitter during operation, preferably at the maximum which is located closest to the edge of the central waveguide.

In general, it is expedient for the purposes of the invention to arrange the quantum layer or the quantum layers such that they overlap at the maximum, that is to say with an antinode, of the standing wave which is formed from the radiation field generated by the quantum well structure in the vertical emitter.

Figure 5:
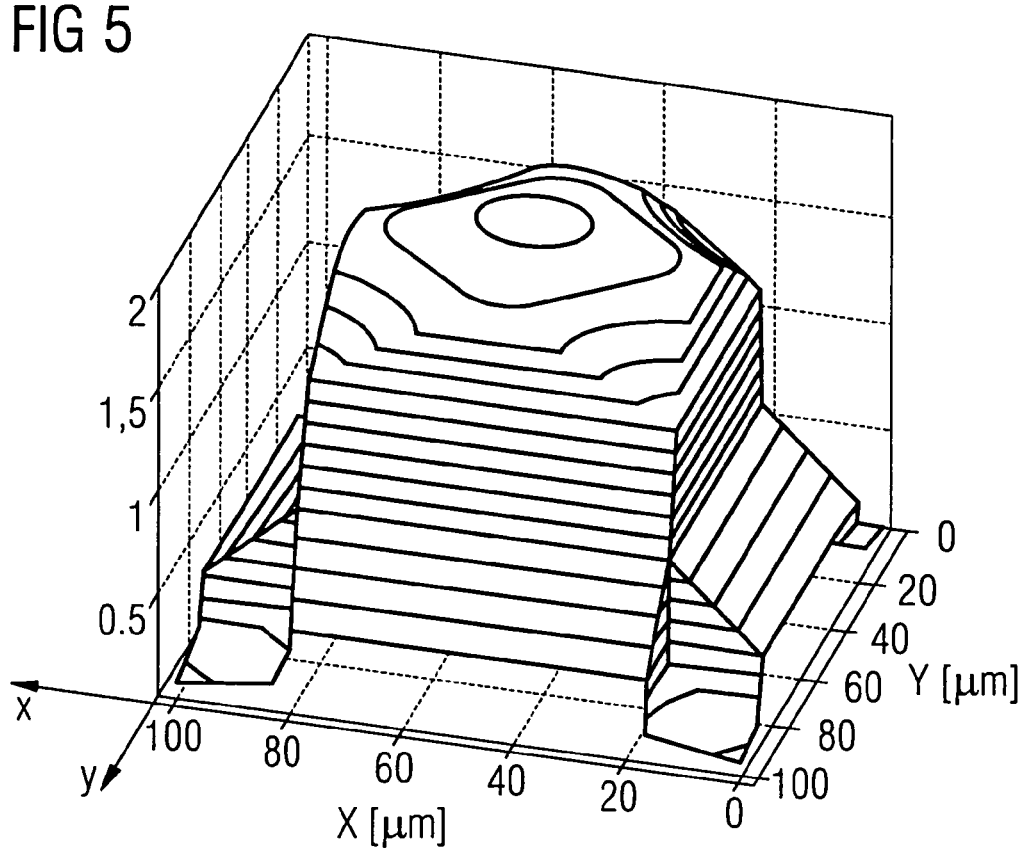
FIG. 5 shows an illustration in the form of a graph of a three-dimensional absorption profile for the second exemplary embodiment of a semiconductor laser apparatus according to the invention.

FIG. 5 shows the calculated absorption profile for a semiconductor laser apparatus as shown in FIG. 4, and the above-mentioned parameters. The graph shows the absorption of the pump field in arbitrary units as a function of the lateral position, that is to say the coordinates X and Y of the coordinate system used in FIG. 4B. This results in advantageously slightly varying absorption for the entire active area of the vertical emitter, with an absorption maximum at the center or at the center of symmetry of the semiconductor laser apparatus. The absorption profile corresponds approximately to a hypergaussian profile.

Figure 6:
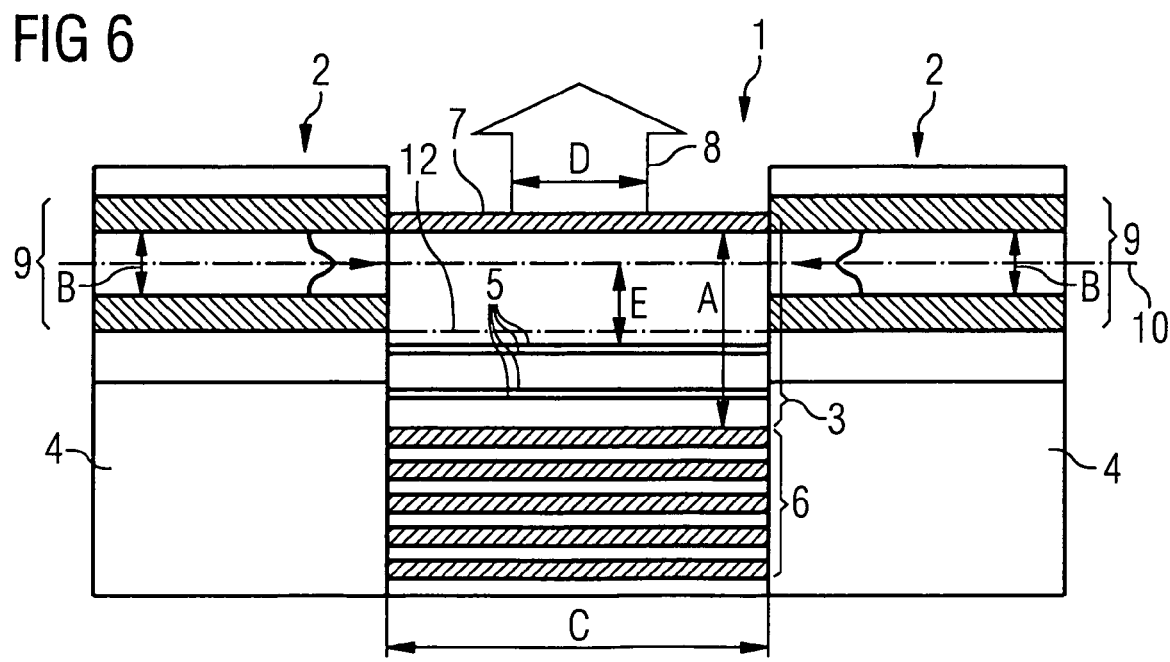
FIG. 6 shows a schematic section view of a third exemplary embodiment of a semiconductor laser apparatus according to the invention, FIGS. 7A, 7B, 7C respectively show a schematic plan view of a fourth, a fifth and a sixth exemplary embodiment of a semiconductor laser apparatus according to the invention.

FIG. 6 shows an exemplary embodiment of a semiconductor laser arrangement similar to the exemplary embodiment shown in FIG. 4A.

In contrast to the last-mentioned exemplary embodiment, the central waveguide 3 is positioned asymmetrically with respect to the pump waveguides 9, that is to say a center axis 12 which is associated with the central waveguide is arranged at a distance from the center axes 10 of the pump waveguides in the vertical direction.

Furthermore, quantum layers 5 are formed on only one side of the center axis 12 of the central waveguide 3. In the illustrated exemplary embodiment, the quantum layers 5 are arranged between the center axis 12 and the mirror 6.

Alternatively, the quantum layers 5 can also be located on the other side of the center axis 12, that is to say between the center axis 12 and the output layer. Both refinements have the advantage that the quantum layers are separated from the center axis 10 of the pump waveguide in a similar manner to that in the exemplary embodiment shown in FIG. 4, and the central waveguide 3 may at the same time be designed to have a narrower width A. This simplifies epitaxial production since, in general, the growth times are lengthened as the layer thickness increases and, in particular, as the width of the waveguides increases and, furthermore, it is more difficult to produce layers without faults.

The width of the central waveguide is preferably between 2 μm and 7 μm, and the distance between the quantum layers and the center axis of the pump waveguide is between 1 μm and 6 μm. The other parameters are selected in the same way as in the exemplary embodiment shown in FIG. 4.

Figure 7A:
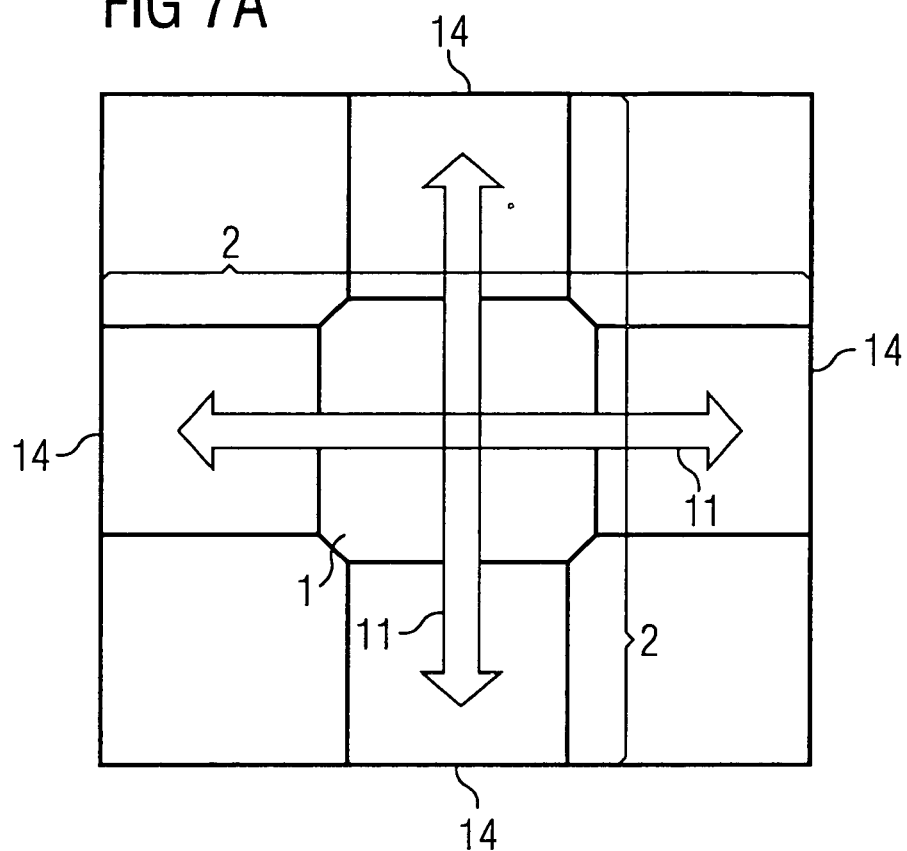
Figure 7B:
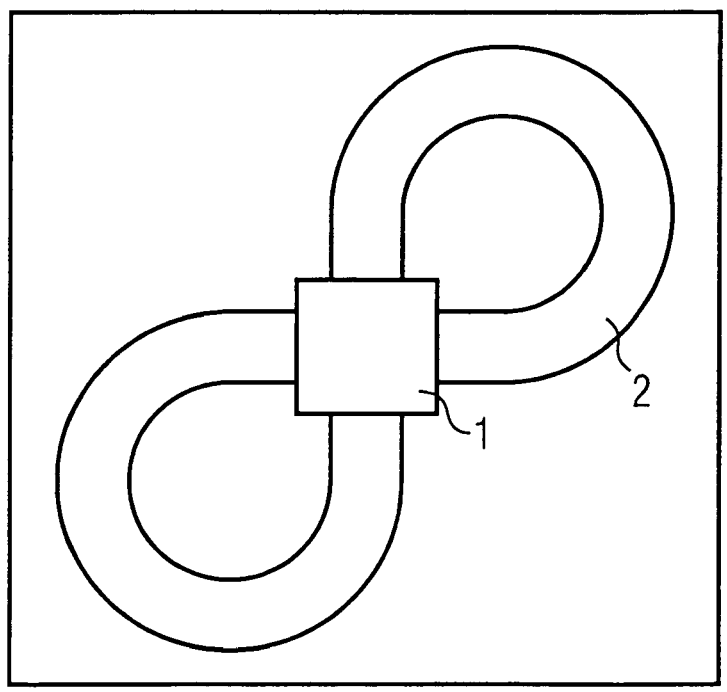
Figure 7C:
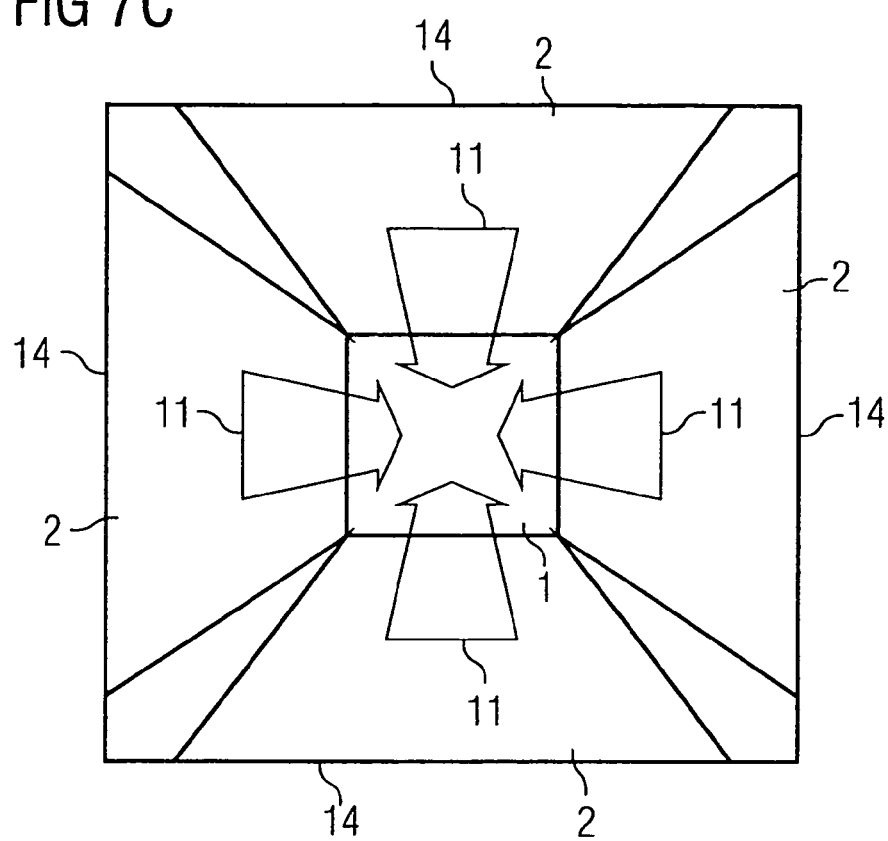

FIGS. 7A, 7B and 7C show plan views of three further exemplary embodiments of the invention. These differ from the exemplary embodiment shown in FIG. 4B in the arrangement of the pump radiation source.

In the exemplary embodiment shown in FIG. 7A, the respectively opposite areas of the pump radiation source jointly form a pump laser 2, so that the resonators of these pump lasers 2 crossover, with the vertical emitter being positioned in the crossing area. The resonator of the pump lasers is thus in each case bounded by the external mirrors or facets 14.

The essential feature of this embodiment of the invention is that the vertical emitter 1 is arranged at least partially within the resonator of a pump laser 2. This advantageously reduces the number of mirrors or facets which are required for the pump lasers, and simplifies production. In this case, it is expedient to form the boundary surface between the vertical emitter and the pump laser area such that the pump radiation is reflected as little as possible, preferably less than 2%. It is, of course, also possible to provide only one pump laser or more than two pump lasers.

In the embodiment of the invention illustrated in FIG. 7B, the vertical emitter is likewise located at least partially within the pump laser resonator. The pump laser is a ring laser, that is to say a laser with a ring resonator. This advantageously means that there is no need for a resonator mirror or facets. This simplifies production, and precludes defects resulting from damaged pump laser mirrors. The ring resonator of the pump laser is 8-shaped in plan view, so that the vertical emitter 1 is pumped on four sides in the crossing area. However, for the purposes of the invention, any other shape of ring resonator may also be provided.

The exemplary embodiment illustrated in FIG. 7C corresponds essentially to the exemplary embodiment shown in FIG. 4B, with the pump lasers being formed with a trapezoidal shape in a plan view. This results in better utilization of the total area of the semiconductor laser apparatus, and thus in a higher pump power for the same total area.

As illustrated, four pump lasers, which are arranged such that they cross over, are provided, in a corresponding manner to the exemplary embodiment shown in FIG. 4B. Alternatively, as is shown in FIG. 7A, two opposite pump laser areas may form a common pump laser, with the vertical emitter 1 once again being arranged at least partially within the pump laser resonator or pump laser resonators. In the last-mentioned variant, the pump laser resonators thus each have a double trapezoidal lateral cross section.

The ranges mentioned in the description should in each case be understood as including the range limits. Furthermore, each of these range details intrinsically itself represents an advantageous refinement to the invention, which it need not necessarily be possible to combine with all the other range details. In case of doubt, the width of the central waveguide and the position of the quantum layers should in each case be chosen such that the quantum layers are arranged within the central waveguide.

The scope of protection of the invention is not limited to the examples given hereinabove. The invention is embodied in each novel characteristic and each combination of characteristics, which includes every combination of any features which are stated in the claims, even if this feature or combination of features is not explicitly stated in the claims or in the examples.

The invention claimed is:

1. An optically pumped semiconductor laser apparatus having
    a vertical emitter which has a central waveguide and a quantum well structure which is arranged within the central waveguide and has at least one quantum layer, and
    a pump radiation source, which optically pumps the quantum well structure and comprises at least one pump waveguide in which the pump radiation is guided, wherein
    the width of the central waveguide is greater than the width of the pump waveguide, and the width of the central waveguide and the width of the pump waveguide are matched to one another such that the quantum well structure of the vertical emitter is pumped uniformly and wherein
    the quantum layer has a distance from the center axis of the pump waveguide, which distance is greater than the beam radius of the pump radiation on entry into the vertical emitter.

2. The semiconductor laser apparatus as claimed in claim 1, wherein
    the pump waveguide has a center axis, and the quantum layer is arranged at a predetermined distance from the center axis of the pump waveguide.

3. The semiconductor laser apparatus as claimed in claim 1, wherein
    the central waveguide has a center axis which is parallel to the center axis of the pump waveguide, or coincides with the center axis of the pump waveguide.

4. The semiconductor laser apparatus as claimed in claim 1, wherein
    the pump radiation is widened within the central waveguide, and overlaps the quantum layer at a predetermined distance from the entry of the pump radiation into the vertical emitter.

5. The semiconductor laser apparatus as claimed in claim 1, wherein
    the vertical emitter has a mirror, which is arranged downstream from the quantum well structure in the vertical direction.

6. The semiconductor laser apparatus as claimed in claim 5, wherein
    the quantum well structure is arranged in the vertical direction between the mirror and an output layer.

7. The semiconductor laser apparatus as claimed in claim 5, wherein the vertical emitter has an associated external mirror which, together with the mirror of the vertical emitter, forms a resonator for the radiation which is emitted from the quantum well structure.

8. The semiconductor laser apparatus as claimed in claim 7, wherein
a non-linear optical element, preferably for frequency doubling, is arranged within the resonator.

9. The semiconductor laser apparatus as claimed in claim 7, wherein
an element for mode coupling, in particular a saturable semiconductor absorber, is arranged within the resonator.

10. The semiconductor laser apparatus as claimed in claim 7, wherein
one mirror of the resonator for the radiation which is emitted from the quantum well structure, in particular the external mirror, is a chirped mirror.

11. The semiconductor laser apparatus as claimed in claim 5, wherein
the vertical emitter has an output mirror, by means of which the radiation which is emitted from the quantum well structure is coupled out.

12. The semiconductor laser apparatus as claimed in claim 5, wherein
the mirror or the mirrors is or are in the form of a Bragg mirror or mirrors.

13. The semiconductor laser apparatus as claimed in claim 1, wherein
the pump radiation source has at least one pump laser.

14. The semiconductor laser apparatus as claimed in claim 13, wherein
the pump radiation source has two pump lasers each having one pump waveguide, whose pump radiation is coupled into the quantum well structure in the opposite direction.

15. The semiconductor laser apparatus as claimed in claim 13, wherein
the pump radiation source has two or more pump lasers, which are arranged in a cruciform shape or star shape around the vertical emitter.

16. The semiconductor laser apparatus as claimed in claim 15, wherein
the pump radiation source has four pump lasers, which are arranged in pairs at right angles to one another.

17. The semiconductor laser apparatus as claimed in claim 13, wherein
the pump laser has a pump laser resonator, and the vertical emitter is arranged at least partially within the pump laser resonator.

18. The semiconductor laser apparatus as claimed in claim 13, wherein
the pump laser is a ring laser.

19. The semiconductor laser apparatus as claimed in claim 13, wherein
the pump laser has a pump laser resonator with an at least partially trapezoidal or double trapezoidal lateral cross section.

20. The semiconductor laser apparatus as claimed in claim 1, wherein
the pump radiation source and the vertical emitter are monolithically integrated.

21. The semiconductor laser apparatus as claimed in claim 1, wherein
the semiconductor laser apparatus is a semiconductor disc laser.

22. The semiconductor laser apparatus as claimed in claim 1, wherein
the semiconductor laser apparatus is designed for pulsed operation, in particular with a pulse duration in the picosecond or femtosecond range.

23. The semiconductor laser apparatus as claimed in claim 1, wherein,
during operation, the quantum well structure produces a radiation field in the vertical emitter, which radiation field forms a standing wave, with the quantum layer being arranged such that it overlaps an antinode of the standing wave.

* * * * *